United States Patent [19]
Kouno et al.

[11] Patent Number: 5,216,424
[45] Date of Patent: Jun. 1, 1993

[54] BINARY DATA CONVERTER

[75] Inventors: Hiroyuki Kouno; Sumitaka Takeuchi; Keisuke Okada, all of Hyogo, Japan

[73] Assignee: Mitsubishi Denki Kabushiki Kaisha, Tokyo, Japan

[21] Appl. No.: 707,145

[22] Filed: May 31, 1991

[30] Foreign Application Priority Data

Jun. 4, 1990 [JP] Japan ................................. 2-146971

[51] Int. Cl.$^5$ ............................................. H03M 7/00
[52] U.S. Cl. ............................................. 341/93; 341/50
[58] Field of Search ................................... 341/93, 50

[56] References Cited
U.S. PATENT DOCUMENTS

| | | | |
|---|---|---|---|
| 3,949,299 | 4/1976 | Song | 341/93 X |
| 4,087,754 | 5/1978 | Song | 341/93 X |
| 4,520,347 | 5/1985 | Campbell, Jr. | 341/93 |

OTHER PUBLICATIONS

"Logic Design of Digital Systems", by Donald L. Dietmeyer, pp. 204-207, 1978.

Primary Examiner—Sharon D. Logan
Attorney, Agent, or Firm—Lowe, Price, LeBlanc & Becker

[57] ABSTRACT

A binary data converter is adapted to convert a positive binary data into a negative binary data represented by a complement on two and vice versa. The conversion is effected as follows. A least significant bit of an inputted binary data is outputted as the least significant bit of the converted binary date as it is. With respect to bit signal other than the least significant bit, respective input bit signals less significant than the corresponding input bit signal are ORed. Depending on the result thereof, inverted or non-inverted signals of the corresponding input bit signals are outputted as the bit signals of the converted binary data. Therefore, carry delay is not generated, and thus the operation speed can be increased. Further, the simple circuit structures can reduce the number of required elements.

10 Claims, 6 Drawing Sheets

BINARY DATA CONVERTER

CROSS-REFERENCE TO RELATED APPLICATIONS

This application is related to copending application Ser. No. 07/790,580, filed Jun. 5, 1991, entitled Binary Counter, commonly assigned with the present invention.

BACKGROUND OF THE INVENTION

1. Field of the Invention

The present invention relates to a binary data converter, and more particularly to a device for converting a positive binary data into a negative binary data represented by a complement on two (2) and vice versa.

2. Description of Prior Art

As is well known, representation by a complement on two of a binary data has been utilized in processing units such as computers for simplifying subtraction processing. Now, the representation by the complement on two will be briefly described. In an operation for converting a certain binary data into the two's complement (i.e. complement on two) data, all bits in the binary data are inverted, and then one is added to a least significant bit. For example, when a binary data of 4 bits "0101" (=+5) is converted into the two's complement data, it become "1011" (=−5). In this data, a most significant bit thereof is treated as a sign bit for indicating whether the data is positive of negative. Thus, if the sign bit is "0", it indicates that a value of the data is positive, and if it is "1", it indicates that the value of the data is negative. The representation by a complement on two has been usually utilized only for representing the data having a negative value. Therefore, if the data of a positive value is required for the processing, a positive binary data itself including a sign bit of "0" is utilized without inversion.

In a course of operation of the binary data, it is sometimes required to convert a positive binary data into a negative binary data represented by the complement on two and vice verse. In order to enable these conversions, binary data converters, e.g., as shown in FIG. 3 have been proposed.

FIG. 3 is a block diagram illustrating a binary data converter of 4 bits, which is disclosed in "Logic Design of Digital Systems" by Donald L. Dietmeyer, p207, FIG. 3.32 "two's Complement Arithmetic System ADPSUB2c". In the figure, input terminals $1a$–$1d$ receive positive binary data or negative binary data represented by a complement on two. The binary data of 4 bits inputted through the input terminals $1a$–$1d$ is inverted by the inverters $2a$–$2d$ and is inputted into one input X of each of half adders $3a$–$3d$. The other input Y of each of the half adders $3a$–$3d$ receives carry outputs from the preceding half adders, respectively. The input Y of the half adder $3a$ at the first stage constantly receives "1". Outputs from the half adders $3a$–$3d$ are applied to output terminals $4a$–$4d$, respectively. Converted binary data is introduced through the output terminals $4a$–$4d$. The output terminal $4e$ to which the half adder $3d$ at the last stage applies the carry output is not generally used.

Operations of the conventional binary data converter shown in FIG. 3 is as follows. It is assumed that a positive binary data "0101" (=+5) of 4 bits is to be converted into a negative binary data represented by the complement on two. As shown in FIG. 3, the all four bits of the binary data "0101" inputted into the input terminals $1a$–$1d$ are inverted by the inverters $2a$–$2d$ and "1010" is resulted therefrom. The inverted bit signals are applied to one input X of each of the half adders $3a$–$3d$, respectively. Therefore, "0" is inputted to the input X of the half adder $3a$ for the least significant bit. "1" is constantly applied to the other input Y of this half adder $3a$. Thus, the half adder $3a$ performs a following operation.

$$0+1=1\text{(carry output "0")}$$

Consequently, the output terminal $4a$ outputs "1". In the carry output "0" of the half adder $3a$ is inputted to the input Y of the half adder $3b$ at the next stage. Similar operations are performed in the half adders $3b$–$3d$, and consequently, the negative binary data "1011" (=−5) represented by the complement on two is outputted form the output terminals $4a$–$4d$.

Each of the half adders $3a$–$3d$ shown in FIG. 3 consist of an AND gate 6 and an exclusive OR circuit 7, as shown in FIG. 4. The AND gate 6 shown in FIG. 4 consists of a NAND gate 61 and an inverter 62, as shown in FIG. 5. The exclusive OR circuit 7 consists o two inverters 71 and 72 and two transmission gates 73 and 74.

The conventional binary data converter circuit thus constructed has such a problem that delay of signals due to the carry outputs from the half adders is caused, resulting in a slow operation speed. Further, since the conventional binary data converter circuit employs the half adders having complicated structures as shown in FIGS. 4 and 5, it requires many transistors, resulting in an expensive circuit. More specifically, (16×n) transistors are required in the binary data converter circuit in which the binary data of n bits is processed on a principle illustrated in FIG. 3. Therefore, each half adder of 4 bits shown in FIG. 3 requires 64 (=16×4) transistors.

SUMMARY OF THE INVENTION

Accordingly, it is an object of the invention to provide a binary data converter in which an operation speed is improved.

Another object of the invention is to provide a binary data converter which has simplified structures, requires fewer elements and is inexpensive.

A binary data converter according to the invention comprises first circuit means provided for a least significant bit signal of an inputted binary data, and a plurality of second circuit means provided for bit signals other than the least significant bit of the inputted binary data. The first circuit means includes means for outputting the least significant bit signal of the inputted binary data without inverting the same. The second circuit means include inverted/non-inverted signal output means for selectively outputting inverted signals and non-inverted signals of bit signals in question depending on logical states of the respective bits signals less significant than the corresponding bit signals.

In the present invention, when the bit signals of the inputted binary data are processed, the logic of the output signals is determined depending on the logical states of the respective bit signals less significant than the signals in question. Therefore, carry delay, which has been caused in the conventional binary data converter circuits, is not generated, and thus the operation speed can be increased. Further, the first circuit means can be formed by a mere signal line and the second means can be formed by simple logic gates, so that the converter requires fewer elements.

The foregoing and other objects, features, aspects and advantages of the present invention will become more apparent from the following detailed description of the present invention when taken in conjunction with the accompanying drawings.

BRIEF DESCRIPTION OF THE PREFERRED EMBODIMENTS

Figure 1:
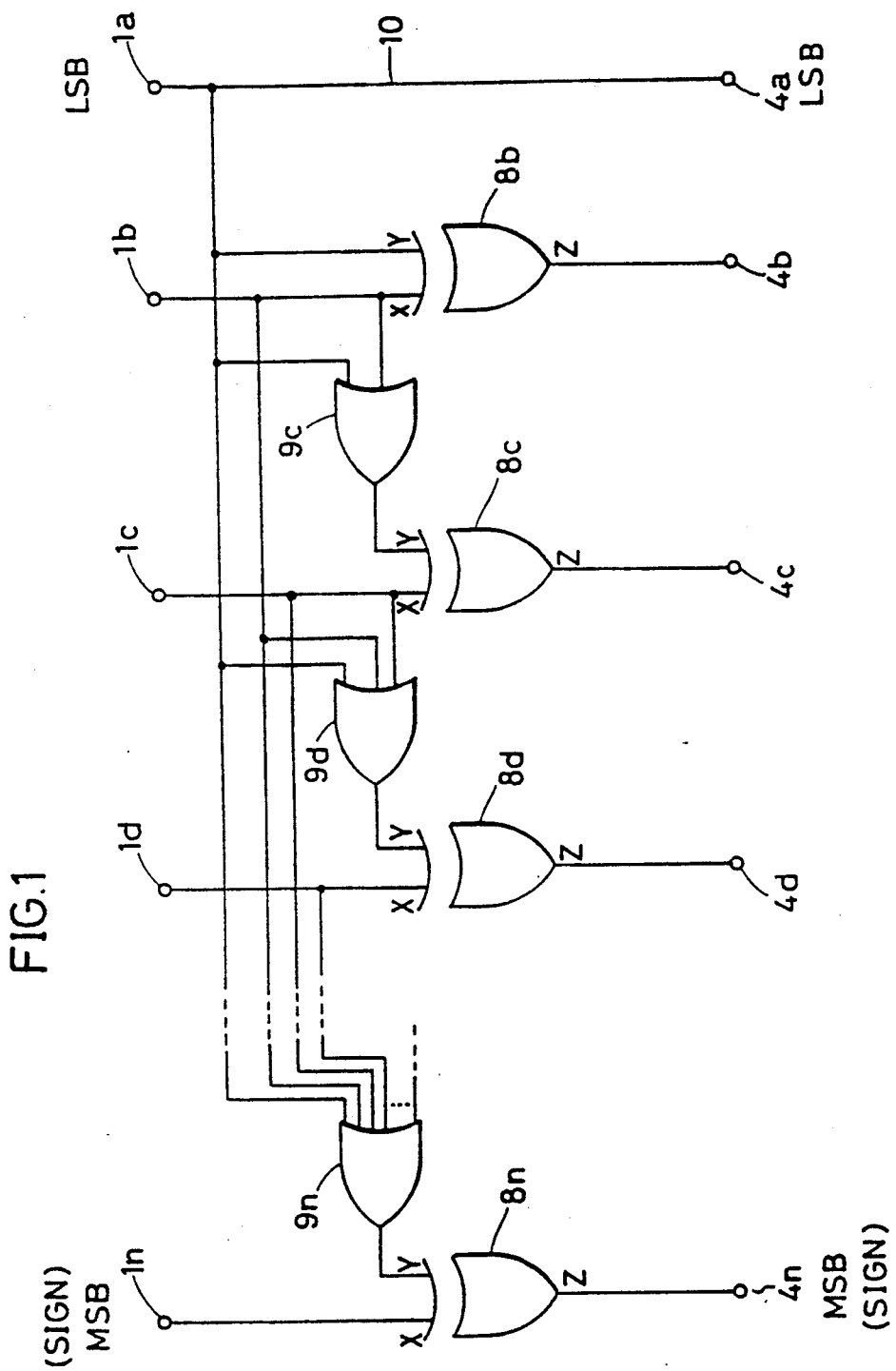
FIG. 1 is a logic circuit diagram illustrating a structure of an embodiment of the invention.

Referring to FIG. 1, which is a logic circuit diagram illustrating structures of an embodiment of the invention, a binary data of n bits is applied in parallel to input terminals $1a$-$1n$. This binary data may be a positive binary data having a sign bit of "0" or may be binary data represented by a complement on two and having a sign bit of "1". A bit signal applied to the input terminal $1a$ is a least significant bit signal of the above binary data, and a bit signal applied to the input terminal $1n$ is a most significant bit signal (i.e., sign bit) of the above binary data. The least significant bit signal inputted through the input terminal $1a$ is applied directly to an output terminal $4a$ through a signal line 10. Respective bit signals inputted through the input terminals $1b$-$1n$ are applied to one input X of each of exclusive OR circuits $8a$-$8n$. The least significant bit signal inputted through the input terminal $1a$ is applied to the other input Y of the exclusive OR circuit $8b$ for a bit next to the least significant bit. OR gates $9c$-$9n$ are associated to the other exclusive OR circuits $8c$-$8n$, respectively. The OR gates $9c$-$9n$ receive bit signals less significant than the corresponding bit signals, respectively. With respect to, e.g., the OR gate $9d$, it receives the bit signals less significant than the corresponding bit signal, i.e., the bit signal from the input terminal $1d$, in other words, it receives the bit signals from the input terminals $1a$-$1c$. The outputs from the respective OR gates $9c$-$9n$ are applied to the other input Y of each of the exclusive OR circuits $8c$-$8n$, respectively. Output terminals Z of the exclusive OR circuits $8b$-$8n$ are connected to the output terminals $4b$-$4n$, respectively. The exclusive OR circuits $8b$-$4n$ form examples of selecting means for selectively outputting inverted signals and non-inverted signals of bit signals applied to the inputs X, depending on the logic of the signals applied to the inputs Y.

Figure 2A:
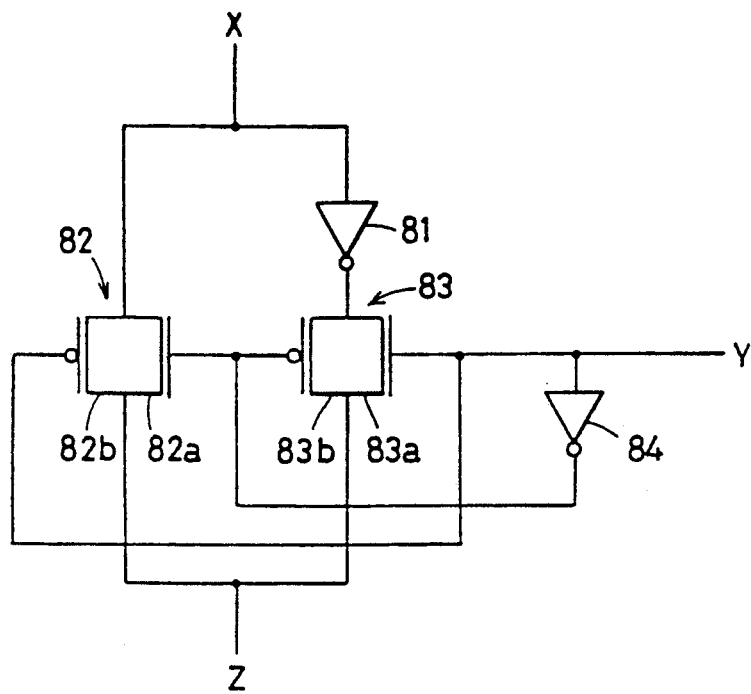
FIG. 2A is a circuit diagram illustrating a structural example of an exclusive OR circuit shown in FIG. 1.

FIG. 2A is a circuit diagram illustrating structures of any one of the exclusive OR circuits $8b$-$8n$ shown in FIG. 1. In the figure, the bit signal applied to the input X is outputted to the output Z through a transmission gate 82. The bit signal applied to the input X is also outputted to the output Z through an inverter 81 and a transmission gate 83. The transmission gate 82 comprises a N-channel MOS transistor $82a$ and a P-channel MOS transistor $82b$ connected in parallel. Similarly, the transmission gate 83 comprises a N-channel MOS transistor $83a$ and a P-channel MOS transistor $83b$ connected i parallel. The signal applied to the other input Y is applied directly to gates of the P-channel MOS transistor $82b$ and N-channel MOS transistor $83a$. The signal applied to the input Y is inverted by the inverter 84 and then is applied to the N-channel MOS transistor $82a$ and the P-channel MOS transistor $83b$. Therefore, the transmission gates 82 and 83 are selectively turned on and turned off, depending on the signal applied to the other input Y.

An operation principle of the embodiment shown in FIGS. 1 and 2A will be described below. It is assumed that the binary data A (=aN, . . a1) of N bits is to be converted into a binary data B (=bN, . . . b1) of N bits. The binary data A is a positive binary data (or a negative binary data represented by a complement on two), and the binary data B is a negative binary data represented by a complement on two (or a positive binary data). There is a following logical relationship between respective bits a1-aN of the binary data A before conversion and respective bits b1-bN of the binary data B after conversion.

$$\begin{aligned}
&b1 = a1 \\
&\text{if } a1 = 0,\ b2 = a2 \\
&\text{if } a1 = 1,\ b2 = \overline{a2} \\
&\text{if } a1 + a2 = 0,\ b3 = a3 \\
&\text{if } a1 + a2 = 1,\ b3 = \overline{a3} \\
&\text{if } a1 + a2 + a3 = 0,\ b4 = a4 \\
&\text{if } a1 + a2 + a3 = 1,\ b4 = \overline{a4} \\
&\quad \vdots \\
&\text{if } a1 + a2 + \ldots a(N-1) + aN = 0,\ bN = aN \\
&\text{if } a1 + a2 + \ldots a(N-1) + aN = 1,\ bN = \overline{aN}
\end{aligned}$$

Thus, the least significant bit a1 of the binary data A consisting of N bits directly becomes the least significant bit b1 of the converted binary data B. With respect to the bits other than the least significant bit, the respective output bits b2-bN become inversion or non-inversion of the corresponding input bits a2-aN. The selection of these inversion and non-inversion is determined depending on the logical state of the input bits less significant than the input bit in question. Thus, when any input bit among those less significant than the input bit in question is "1", the output bit is the inverted signal of the input bit.

The embodiment shown in FIGS. 1 and 2A is constructed so as to achieve the logical relationship stated above. Each of the OR gates $9c$-$9n$ determines whether any input bit signal among those less significant than the corresponding input bit signal is "1". The selection of the inversion and non-inversion of the input bit signal is effected by each of the exclusive OR circuits $8b$-$8n$. When all of the bit signals less significant than the corresponding input bit signal are "0", the logical sum thereof becomes "0" and the signal of "0", i.e., at a "L" level, is applied to the input Y of the exclusive OR circuit. In this case, the transmission gate 82 is therefore turned on and the transmission gate 83 is turned off. As a result, the input bit signal applied to the input X of the exclusive OR circuit is outputted from the output Z through the transmission gate 82 without inversion. On the other hand, if any input bit signal among those less significant than the corresponding input bit signal is "1", the logical sum thereof becomes "1", so that the signal of "1" (i.e., at a "H" level) is applied to the other input Y of the corresponding exclusive OR circuit. In this case, the transmission gate 83 is turned on and the transmission gate 82 is turned off. As a result, the input bit signal applied to the input X of the exclusive OR circuit is outputted from the output Z through the transmission gate 83 after being inverted by the inverter 81.

Now, the operations of the embodiment shown in FIGS. 1 and 2A will be further described in accordance with a more specific example. It is assumed that a binary data of 4 bits "1011" ($= -5$) represented by the complement on two is to be converted into the positive binary data. In this case, the least significant bit signal in the binary data "1011" inputted to the input terminals 1a–1d is outputted through the signal line 10 from the output terminal 4a without being inverted. With respect to other bits, since the less significant input bit signal(s) (in this case, the least significant bit signal) is "1", all of the bit signals are outputted after inversion. Thus, the output terminals 4a–4d output the binary data "0101" ($= +5$) converted to a positive value.

Figure 3:
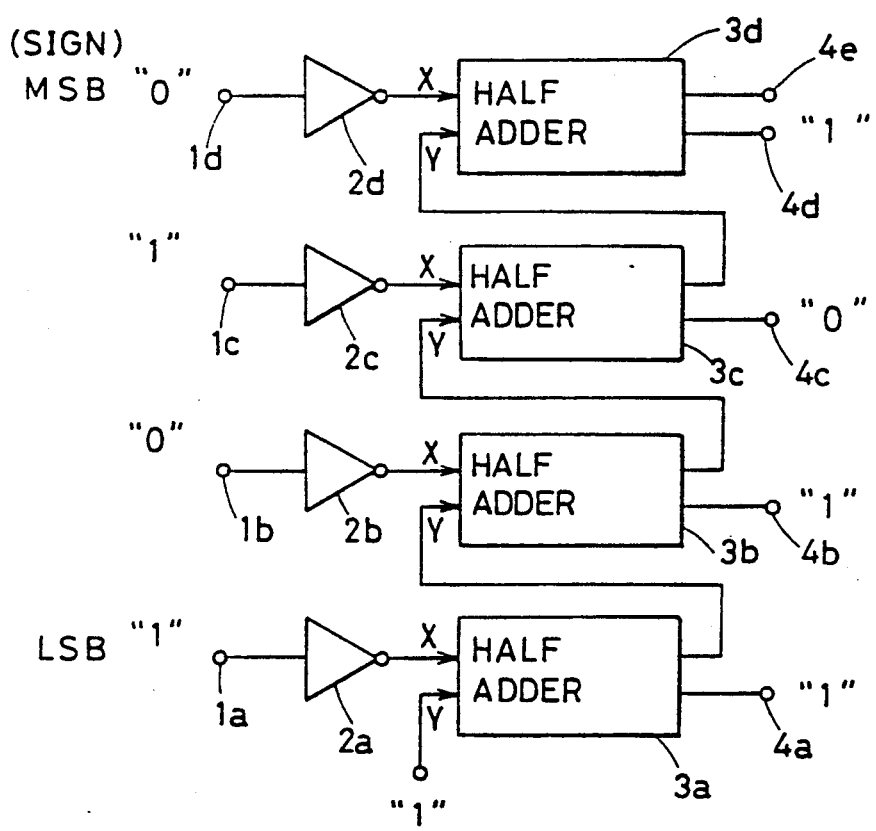
FIG. 3 is a block diagram illustrating a structure of a conventional binary data processing circuit.
Figure 4:
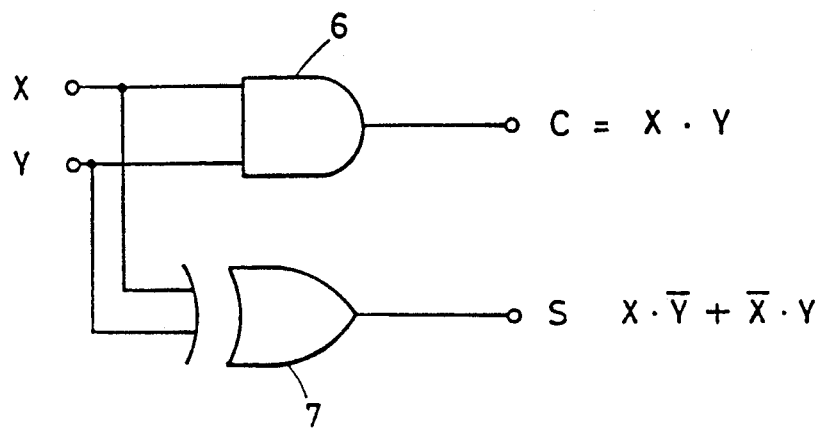
FIG. 4 is a logic circuit diagram illustrating a structure of a half adder shown in FIG. 3.
Figure 5:
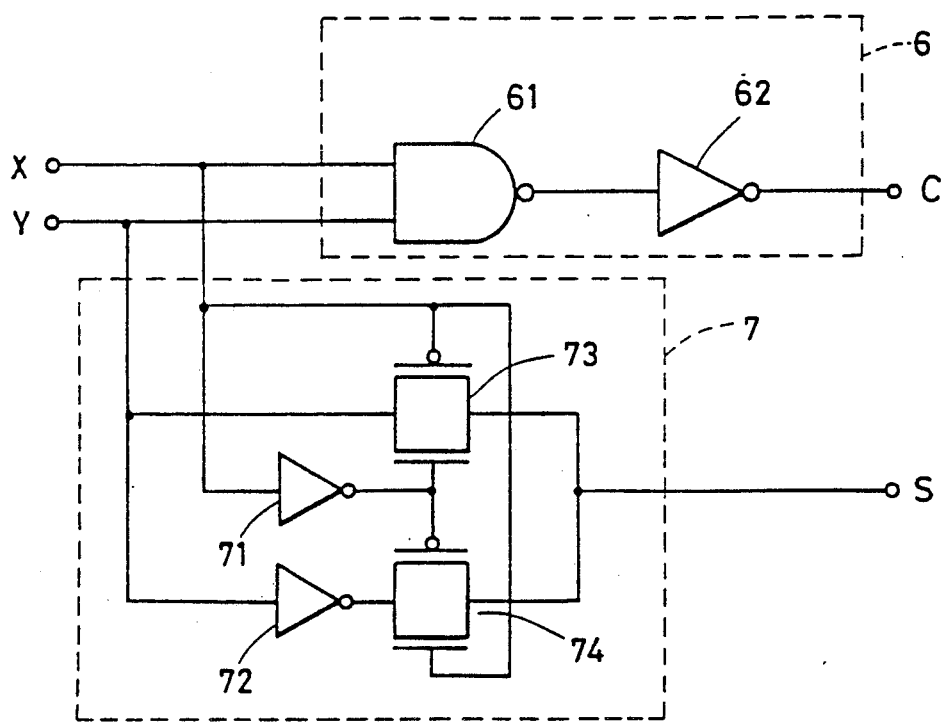
FIG. 5 is a circuit illustrating a structure of a half adder shown in FIG. 3 in greater detail.

In the embodiments described above, when the binary data is inputted to the input terminals 1a–1n, the logic of the respective bit signals of the converted binary data is immediately determined, so that the carry delay, which has been caused in the conventional binary data converter circuit shown in FIG. 3, can be prevented, resulting in a high speed operation. Further, the element number of the transistors which are required for constructing the binary data converter can be reduced, as compared with the conventional binary data converter. Specifically, the conventional binary data processing circuit shown in FIG. 3 requires $(16 \times n)$ transistors for processing the binary data of n bits. The binary data processing device shown in FIGS. 1 and 2A requires $\{8(n-1)+(n-2)(n+1)\}$ transistors. In this equation, the first term $8(n-1)$ is the number of the transistors for the exclusive OR circuits 8b–8n. The second term $(n-2)(n+1)$ is the number of the transistors for the OR gates 9c–9n. In order to process the binary data of 4 bits, the conventional binary data processing circuits requires 64 transistors, while the binary data processing device shown in FIGS. 1 and 2A can be formed of 34 transistors, which is reduced by 30.

A solution of a following quadratic equation is $n = 10$.

$$16n = 8(n-1) + (n-2)(n+1)$$

This means that the element number of the transistors required in the embodiment shown in FIGS. 1 and 2A can be less than that in the conventional binary data converter circuit shown in FIG. 3, so long as the binary data includes up to 9 bits.

Figure 2B:
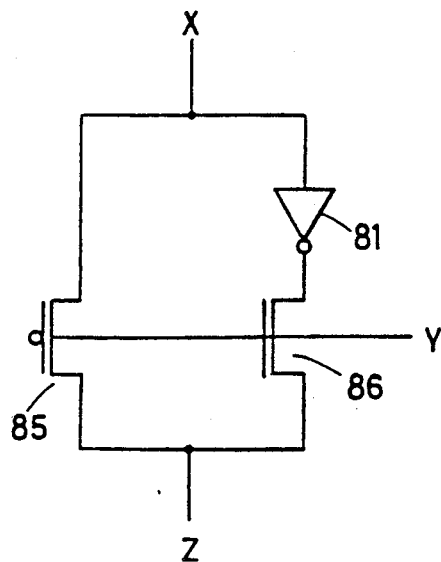
FIG. 2B is a circuit diagram illustrating another structure of an exclusive OR circuit shown in FIG. 1.

FIG. 2B illustrates another structural example applied for the respective exclusive OR circuits 8b–8n. As shown therein, the structures in FIG. 2B form an exclusive OR circuit which can be constructed of one inverter 81, one P-channel MOS transistor 85 and one N-channel MOS transistor 86, so that the required element number can be further reduced, as compared with the embodiment employing the exclusive OR circuits shown in FIG. 2A. However, the transmission gates 82 and 83 shown in FIG. 2A can function even if there is a fault in either of the two MOS transistors included in each gate, so that a reliability in the circuit operation is improved, while the exclusive OR circuit shown in FIG. 2B has not such benefit.

Figure 6:
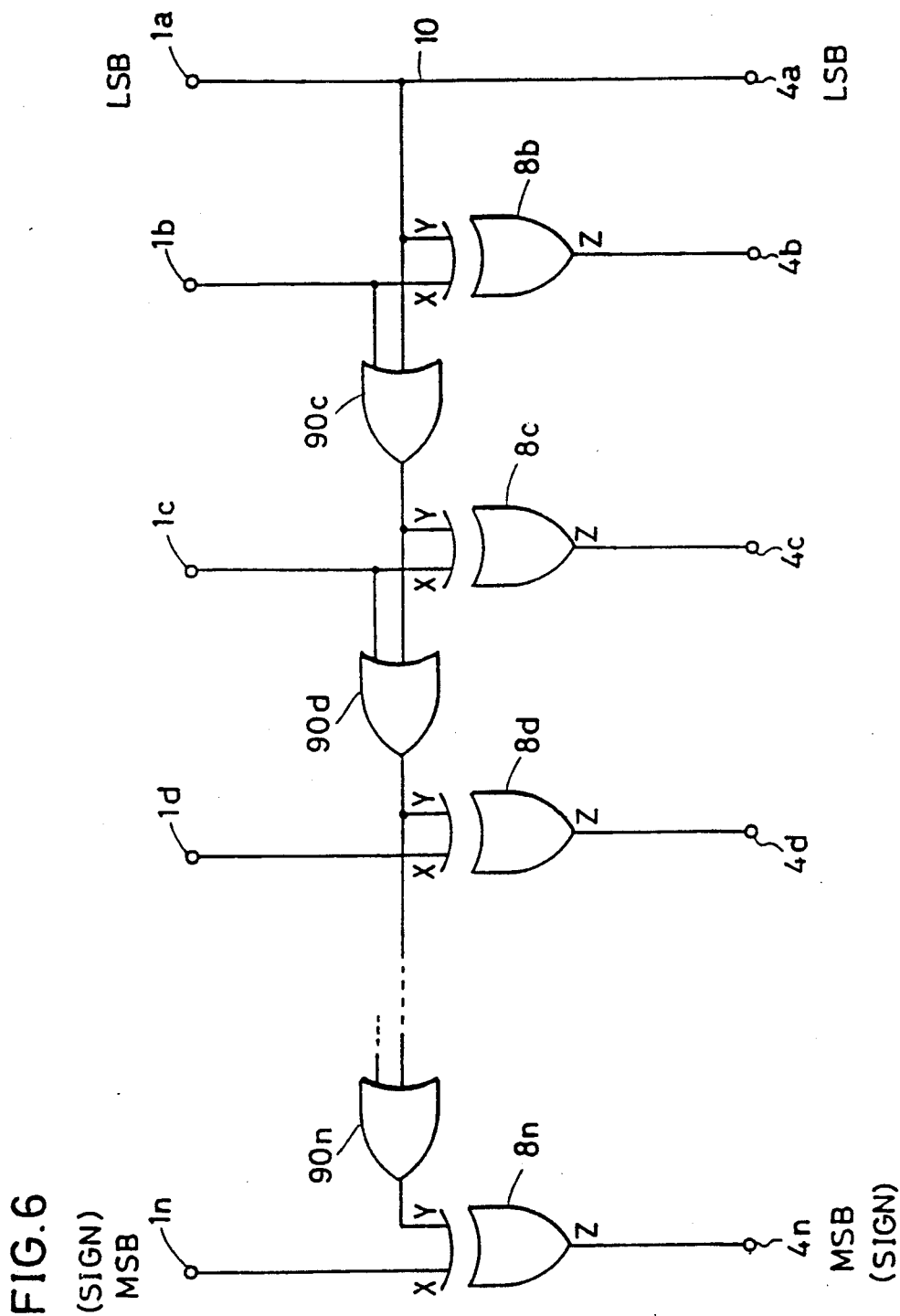
FIG. 6 is a logic circuit diagram illustrating a structure of another embodiment of the invention.

FIG. 6 is a logic circuit diagram illustrating a structure of a binary data converting device according to another embodiment of the present invention. Referring to FIG. 6, the present embodiment is provided with two-input OR gates 90c–90n instead of OR gates 9c–9n of the embodiment of FIG. 1. The other components of the embodiment of FIG. 6 is similar to those of the embodiment of FIG. 1. The equivalent components are denoted by the same reference number and the description thereof will not be repeated. The least significant bit signal (the bit signal provided from input terminal 1a) and an immediate lower significant bit signal (the bit signal provided from input terminal 1b) are applied to two-input OR gate 90c. The output of an immediate lower two-input OR gate and an immediate lower significant bit signal are applied to two-input OR gates 90d–90n. For example, in the case of two-input OR gate 90d, the output of two-input OR gate 90c is applied as the output of an immediate lower two-input OR gate, and the bit signal provided from input terminal 1c is applied as the immediate lower significant bit signal.

In the embodiment of FIG. 6, the determination of whether there is "1" in at least one of the input bit 1 signals in the lower side of an arbitrary bit (excluding the least significant bit) is carried out using the two-input OR gate belonging to that bit and all the two-input OR gates belonging to lower bits. The remaining operations are similar to those of the embodiment of FIG. 1.

Although the operation speed in the embodiment of FIG. 6 is slower than that of the embodiment of FIG. 1 due to the input bit signal being transmitted to an higher significant bit through each two-input OR gate, the circuit structure is further simplified than that of the embodiment of FIG. 1.

Figure 7:
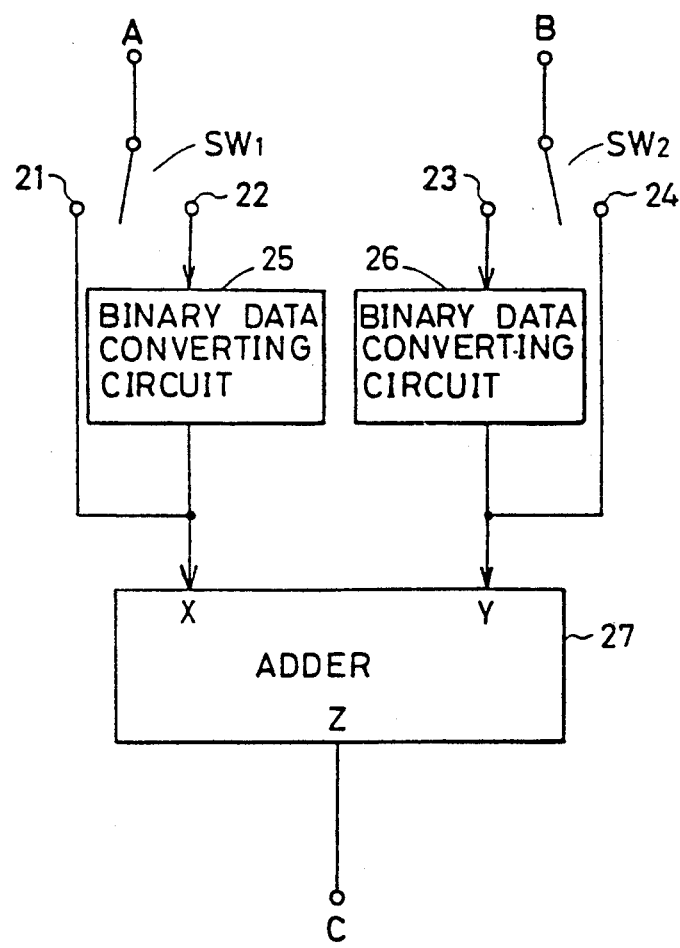
FIG. 7 is a block diagram illustrating a structure of an adder/subtractor implemented using the binary data converting circuit of the invention.

FIG. 7 is an application of the binary data converting device of the present invention, employed in an adder/-subtractor. Referring to FIG. 7, binary data A is applied to either of terminals 21 or 22 by switch SW1. Binary data A applied to terminal 21 is directly provided to one input terminal X of an adder 27. Binary data A applied to terminal 22 has the polarity thereof negatively inverted by a binary data converting circuit 25, and then provided to one input terminal X of adder 27 as binary data ($-A$). Binary data B is applied to either of terminals 23 or 24 by switch SW2. Binary data B applied to terminal 23 has the polarity thereof negatively inverted by a binary data converting circuit 26, and then provided to the other input terminal Y of adder 27 as binary data ($-B$). Binary data B applied to terminal 24 is directly provided to the other input terminal Y of adder 27. The binary data converting circuits of FIGS. 1 and 6 are used as binary data converting circuits 25 and 26. Adder 27 adds the binary data applied to one input terminal X and the binary data applied to the other input terminal Y to provide the added result from output terminal Z as binary data C.

The adder/subtractor of FIG. 7 carries out the following calculations of (1) to (4) according to the switching of switches SW1 and SW2.

(1) When terminals 21 and 24 are selected:

$C = A + B$ (2) When terminals 21 and 23 are selected:

$$C = A + (-B) = A - B$$

(3) When terminals 22 and 24 are selected:

$$C = (-A) + B = -A + B$$

(4) When terminals 22 and 23 are selected:

$$C = (-A) + (-B) = -A - B$$

As described in the foregoing, the adder/subtractor of FIG. 7 can carry out adding/subtracting of binary data A and B in arbitrary combinations.

According to the invention, as described hereinabove, there is no carry delay, which has been caused in the conventional binary data processing circuit, and thus the operation speed can be increased. Further, the circuit structures can be simple, so that the required element number can be reduced, and thus inexpensive binary data processing devices can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A binary data converter for converting binary data represented by a plurality of bit signals into a two's complement binary data representation, represented by a complement on two, comprising:

first circuit means provided for a least significant one of said bit signals of an inputted binary data; and a plurality of second circuit means provided for respective ones of said bit signals other than the least significant bit of the inputted binary data;

said first circuit means including non-inverting output means for outputting the lest significant bit signal of the inputted binary data; and said second circuit means including inverted/non-inverted signal output means for selectively outputting an inverted signal or a non-inverted signal of a bit signal of said binary bit data responsive to logical states of the respective bit signals less significant than an applied corresponding bit signal, said inverted/non-inverted signal output means including logic operation means for performing a logic operation of respective bit signals less significant than a corresponding bit signal; and selector means for selectively outputting an inverted signal or a non-inverted signal of the corresponding bit signal, depending on an output rom said logic operation means, wherein said logic operation means has a number of inputs equal to a number of the less significant bit signals.

2. A binary data converter according to claim 1, wherein said logic operation means is an OR circuit for performing a logic sum operation.

3. A binary data converter according to claim 1, wherein said selector means is an exclusive OR circuit.

4. A binary data converter according to claim 1, wherein said first circuit means is a signal line for transmitting the inputted least significant bit signal to an output side.

5. A binary data converter for converting binary data represented by a plurality of bit signals into a two's complement binary data representation, represented by a complement on two, comprising:

means for receiving binary data;

a number of input nodes equal to a number of bits of said binary data and ordered from least to most significant bit positions;

a number of output nodes equal to said number of bits of said binary data and ordered from least to most significant bit positions;

a number of inverting means equal to one less than said number of its of said binary data for selectively inverting respective bit signals applied thereto in response to respective control signals, said inverting means having respective input nodes connected to most significant ones of said input nodes and respective outputs connected to most significant ones of said output nodes;

non-inverting connection means for supplying a bit signal applied to the least significant bit input node to the least significant bit output node; and a number of logic means equal to one less than said number of bits of said binary data and ordered in correspondence with respective ones of said inverting means for providing respective control signals thereto, each of said logic means having a number of inputs equal to a number of said input nodes of lower order than an order of the respective logic means and providing an output responsive to a first logic level of any of the bit signal on lower order ones of said input node.

6. A binary data converter for converting binary data represented by a plurality of bit signals into a two's complement binary data representation, represented by a complement on two, comprising:

N input nodes ordered from 1 to N corresponding to least to most significant bit positions, respectively;

N output nodes ordered from 1 to N corresponding to least to most significant bit positions, respectively;

$N-1$ inverting means ordered from 2 through N responsive to respective control signals for selectively inverting respective bit signals applied to input nodes 2 through N and providing said selectively inverted bit signals to respective ones of said output nodes 2 through N;

non-inverting connection means for supplying a bit signal applied to input terminal 1 to output terminal 1; and $N-1$ OR logic means ordered from 2 through N, each i-th of said logic means having $i-1$ inputs connected to respective input nodes 1 through $i-1$ and providing a logical OR signal of said $i-1$ inputs as a control signal to i-th of said inverting means.

7. A binary data converter for converting binary data into a two's complement representation, comprising:

first through third input terminals;

first through third output terminals;

first connection means for connecting said first input terminal to said first output terminal;

first exclusive OR (XOR) gate means having first and second inputs connected to said first and second input terminals, respectively, and an output connected to said second output terminal;

first OR gate means having first and second inputs connected to said first and second input terminals, respectively, and an output supplying a first control signal;

second XOR gate means having a first input connected to said third input terminal, a second input connected to said output of said first OR gate for receiving said first control signal, and an output connected to said third output terminal;

fourth input and output terminals;

second OR gate means having first though third inputs connected to said first through third input terminals, respectively, and an output supplying a second control signal; and third XOR gate means having a first input connected to said fourth input terminal, a second input connected to said second OR gate means output for receiving said second control signal, and, an output connected to said fourth output terminal.

8. The binary converter of claim 7, further comprising:

fifth input and output terminals;

third OR gate means having first through fourth inputs connected to said first through fourth input terminals, respectively, and an output supplying a third control signal; and fourth XOR gate means having a first input connected to said fifth input terminal, a second input connected to said third IR gate means output for receiving said third control signal, and an output connected to said fifth output terminal.

9. The binary converter of claim 8, further comprising:

sixth input and output terminals;

fourth OR gate means having first through fifth inputs connected to said first through fifth input terminals, respectively, and an output supplying a fourth control signal;

fifth XOR gate means having a first input connected to said sixth input terminal, a second input connected to said fourth OR gate means output for receiving said fourth control signal, and an output connected to said fifth output terminal.

10. A binary data converter for converting binary data represented by N-bit signals into a N-bit two's complement binary data representation, represented by a complement on two, comprising:

first through N-th input terminals;

first through N-th output terminals;

first connection means for connecting said first input terminal to said first output terminal;

first through (N−1)-th exclusive OR (XOR) gate means; and first through (N=2)-th OR gate means, wherein said first XOR gate means has first and second inputs connected to said first and second input terminals respectively, and an output terminal connected to said second output terminal, each i-th (i=2 through N−1) of said XOR gate means has first and second inputs connected to (i+1)-th of said input terminals and the output of the (i−1)-th OR gate means, respectively, and an output connected to (i+1)-th of said output terminals, and each k-th (k=1 through N−2) of said OR gate means has k+1 inputs respectively connected first through (k+1)-th of said input terminals.

* * * * *